(12) United States Patent
Tanikawa et al.

(10) Patent No.: US 11,107,926 B2
(45) Date of Patent: Aug. 31, 2021

(54) OXIDE SEMICONDUCTOR FILM AND METHOD FOR PRODUCING SAME

(71) Applicant: FLOSFIA INC., Kyoto (JP)

(72) Inventors: Tomochika Tanikawa, Kyoto (JP); Toshimi Hitora, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 16/313,239

(22) PCT Filed: Jun. 30, 2017

(86) PCT No.: PCT/JP2017/024274
§ 371 (c)(1),
(2) Date: Dec. 26, 2018

(87) PCT Pub. No.: WO2018/004008
PCT Pub. Date: Jan. 4, 2018

(65) Prior Publication Data
US 2019/0157400 A1    May 23, 2019

(30) Foreign Application Priority Data
Jun. 30, 2016   (JP) .............................. JP2016-131158

(51) Int. Cl.
*H01L 29/786*   (2006.01)
*H01L 29/12*    (2006.01)
(Continued)

(52) U.S. Cl.
CPC .... *H01L 29/7869* (2013.01); *H01L 21/02565* (2013.01); *H01L 29/12* (2013.01); *H01L 29/78* (2013.01); *H01L 29/786* (2013.01)

(58) Field of Classification Search
CPC .............. H01L 29/66075; H01L 29/68; H01L 21/0242; H01L 21/02565; H01L 21/02579;
(Continued)

(56) References Cited

U.S. PATENT DOCUMENTS

2005/0062134 A1   3/2005  Ho et al.
2005/0178424 A1   8/2005  Yotsuhashi et al.
(Continued)

FOREIGN PATENT DOCUMENTS

JP    2005-340308    12/2005
JP    2013-58637      3/2013
(Continued)

OTHER PUBLICATIONS

International Search Report dated Sep. 26, 2017 in International (PCT) Application No. PCT/JP2017/024274.
(Continued)

*Primary Examiner* — Cheung Lee
(74) *Attorney, Agent, or Firm* — Wenderoth, Lind & Ponack, L.L.P.

(57) ABSTRACT

A new and useful oxide semiconductor film with enhanced p-type semiconductor property and the method of manufacturing the oxide semiconductor film are provided. A method of manufacturing an oxide semiconductor film including: generating atomized droplets by atomizing a raw material solution containing a metal of Group 9 of the periodic table and/or a metal of Group 13 of the periodic table and a p-type dopant; carrying the atomized droplets onto a surface of a base by using a carrier gas; causing a thermal reaction of the atomized droplets adjacent to the surface of the base under oxygen atmosphere to form the oxide semiconductor film on the base.

14 Claims, 11 Drawing Sheets

(51) Int. Cl.
*H01L 29/78* (2006.01)
*H01L 21/02* (2006.01)

(58) Field of Classification Search
CPC ......... H01L 21/02628; H01L 21/02631; H01L 29/12; H01L 29/78; H01L 29/786; H01L 29/7869; H01L 29/808
See application file for complete search history.

(56) References Cited

U.S. PATENT DOCUMENTS

| | | | |
|---|---|---|---|
| 2007/0114527 A1* | 5/2007 | Kumaki | H01L 51/5234 257/43 |
| 2008/0038906 A1 | 2/2008 | Ichinose et al. | |
| 2014/0091302 A1* | 4/2014 | Chou | H01L 29/12 257/43 |
| 2015/0087110 A1* | 3/2015 | Facchetti | H01L 21/02381 438/104 |
| 2015/0206979 A1* | 7/2015 | Shimada | H01L 29/41733 257/43 |
| 2016/0060788 A1 | 3/2016 | Oda et al. | |
| 2016/0218223 A1* | 7/2016 | Nomura | H01L 29/66969 |
| 2017/0301738 A1* | 10/2017 | Abe | H01L 29/861 |

FOREIGN PATENT DOCUMENTS

| | | |
|---|---|---|
| JP | 2016-081946 | 5/2016 |
| KR | 10-2016-0026761 | 3/2016 |
| WO | 2005/047560 | 5/2005 |

OTHER PUBLICATIONS

Kaneko, Kentaro, "Growth and Physical Properties of Corundum-Structured Gallium Oxide Alloy Thin Films", Dissertation, Kyoto Univ., Mar. 2013, pp. 1-116, with English Abstract.

Tatsuya, Takemoto, "Power Device Gallium Oxide", Thermal Conductivity, P-type . . . Overcoming Issues and Putting It Into Practical Use. [Online], EE Times, Japan, pp. 1-5, Retrieved Jun. 21, 2016 from http://eetimes.jp/ee/articles/1402/27/news028_2.html with partial English translation.

Koffyberg, F.P., "Optical Bandgaps and Electron Affinities of Semiconducting $Rh_2O_3$(I) and $Rh_2O_3$(III)", J. Phys. Chem. Solids vol. 53, No. 10, pp. 1285-1288, 1992.

Hosono, Hideo, "Functional Development of Oxide Semiconductor" Physics Research, Electronic Version, vol. 3, No. 1, Mar. 12, 2011 (Merger issue of Sep. 2013 and Feb. 2014) pp. 1-15, with partial English translation.

Extended European Search Report dated Feb. 6, 2020 in corresponding European Patent Application No. 17820362.6.

Japanese Notice of Reasons for Refusal dated May 25, 2021 in corresponding Japanese Patent Application No. 2018-525322 with English translation.

Korean Notification of Reason for Refusal dated Jun. 29, 2021 in corresponding Korean Application No. KR 10-2018-7037577 with English translation.

Indian Office Action dated Jun. 3, 2021 in corresponding Indian Application No. 201817049171.

* cited by examiner

OXIDE SEMICONDUCTOR FILM AND METHOD FOR PRODUCING SAME

TECHNICAL FIELD

The present invention relates to an oxide semiconductor film that is useful as a p-type semiconductor. Also, the present invention relates to a method for manufacturing an oxide semiconductor film. The present invention also relates to a semiconductor device including an oxide semiconductor film. Furthermore, the present invention relates to a semiconductor system including an oxide semiconductor film.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices including an inverter. Also, gallium oxide is expected to be applied to a light emitting and receiving element such as a light emitting diode (LED) and a sensor, since gallium oxide has a wide band gap. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refers to $In_XAl_YGa_ZO_3$ ($0 \leq X \leq 2$, $0 \leq Y \leq 2$, $0 \leq Z \leq 2$, $X+Y+Z=1.5 \sim 2.5$) and can be viewed as the same material system containing gallium oxide.

In recent years, gallium oxide based p-type semiconductors have been studied. For example, PTL 1 describes a base showing p-type conductivity to be obtained by forming a $\beta$-$Ga_2O_3$ based crystal by floating zone method using MgO (p-type dopant source). Also, PTL 2 discloses to form a p-type semiconductor by using an ion implantation of a p-type dopant into $\alpha$-$(Al_XGa_{1-X})_2O_3$ single crystalline film obtained by Molecular Beam Epitaxy (MBE) method. However, NPL 2 discloses that a p-type semiconductor was not obtained by the methods disclosed in PTLs 1 and 2 (NPL2). In fact, there has been no reports of any success in forming a p-type semiconductor by use of the methods disclosed in PTLs 1 and 2. Therefore, feasible p-type oxide semiconductor and a method of manufacturing a p-type oxide semiconductor have been desired.

Also, as described in NPLs 3 and 4, for example, a use of $Rh_2O_3$ or $ZnRh_2O_4$ as a p-type semiconductor has been considered. Nevertheless, $Rh_2O_3$ was difficult to be formed into a single crystal even when an organic solvent is used, because raw material concentration for $Rh_2O_3$ tends to be diluted especially during film-formation that may cause a problem affecting film-formation. Furthermore, electron density of $Rh_2O_3$ was too high. Also, $ZnRh_2O_4$ was insufficient for LED devices and power devices due to low mobility and a narrow band gap. Therefore, they were not necessarily satisfactory.

CITATION LIST

Patent Literature

PTL 1: JP2005-340308A
PTL 2: JP2013-58647A

Non Patent Literature

NPL 1: Kaneko, Kentaro, "Fabrication and physical properties of corundum structured alloys based on gallium oxide", Dissertation, Kyoto Univ., March 2013

NPL 2: Tatsuya, Takemoto, EE Times, Japan "power device gallium oxide" Thermal conductivity, p-type . . . overcoming issues and putting it into practical use. [online], Retrieved Jun. 21, 2016, from http://eetimes.jp/ee/articles/1402/27/news028_2.html NPL 3: F. P. KOFFYBERG et al., "optical bandgaps and electron affinities of semiconducting Rh2O3(I) and Rh2O3(III)", J. Phys. Chem. Solids Vol. 53, No. 10, pp. 1285-1288, 1992

NPL 4: Hideo Hosono, "Functional development of oxide semiconductor" Physics Research, Electronic version, Vol. 3, No. 1, 031211 (Merger issue of September 2013 and February 2014)

SUMMARY OF INVENTION

Technical Problem

It is an object of a present inventive subject matter to provide a new and useful oxide semiconductor film with p-type semiconductor property. It is also an object of a present inventive subject matter to provide a method of manufacturing the oxide semiconductor film.

Solution to Problem

As a result of keen examination to achieve the object, the present inventors learned that a method of manufacturing a p-type oxide semiconductor including generating atomized droplets by atomizing a raw material solution containing a metal of Group 9 of the periodic table and/or a metal of Group 13 of the periodic table and a p-type dopant; carrying the atomized droplets onto a surface of a base by using a carrier gas; and causing a thermal reaction of the atomized droplets adjacent to the surface of the base under an atmosphere of oxygen to form the oxide semiconductor film on the base is able to obtain an oxide semiconductor film including as a major component a metal oxide that contains a metal of Group 9 of the periodic table and/or a metal of Group 13 of the periodic table; a p-type dopant in the oxide semiconductor film; a p-type carrier concentration of the oxide semiconductor film being $1 \times 10^{15}/cm^3$ or more; and a hole mobility of the oxide semiconductor film being 1 $cm^2/Vs$ or more. Furthermore, the obtained oxide semiconductor film is useful for semiconductor device using gallium oxide ($Ga_2O_3$) that has a wide band gap. They then found that such an oxide semiconductor film obtained as mentioned above is capable of solving the conventional problem as mentioned above.

After learning the above findings, the present inventors have made further research to complete the present invention. That is, the present invention relates to the followings.

[1] An oxide semiconductor film including: a metal oxide as a major component including a metal of Group 9 of the periodic table and/or a metal of Group 13 of the periodic table; a p-type dopant in the oxide semiconductor film; a p-type carrier concentration of the oxide semiconductor film being $1 \times 10^{15}/cm^3$ or more; and a hole mobility of the oxide semiconductor film being 1 $cm^2/Vs$ or more.

[2] The oxide semiconductor film of [1] above, wherein the metal of Group 9 includes rhodium, iridium, or cobalt.

[3] The oxide semiconductor film of [1] or [2] above, wherein the metal of Group 13 includes at least one metal selected from among indium, aluminum, and gallium.

[4] The oxide semiconductor film of [1] to [3] above, wherein the p-type dopant includes magnesium.

[5] A semiconductor device including: a semiconductor layer including the oxide semiconductor film of any of [1] to [4]; and an electrode.
[6] The semiconductor device of [5] above further including: a thermoelectric conversion element including a p-type semiconductor layer comprising the oxide semiconductor of any of [1] to [4] above.
[7] The semiconductor device of [5] or [6] above, further including: an n-type semiconductor layer including as a major component an oxide semiconductor that, includes a metal of Group 13 of the periodic table.
[8] A semiconductor system including: the semiconductor device of any of [5] to [7].
[9] A method of manufacturing an oxide semiconductor film including: generating atomized droplets by atomizing a raw material solution including a metal of Group 9 of the periodic table and/or a metal of Group 13 of the periodic table and a p-type dopant; carrying the atomized droplets onto a surface of a base by using a carrier gas; and causing a thermal reaction of the atomized droplets adjacent to the surface of the base under an atmosphere of oxygen to form the oxide semiconductor film on the base.
[10] The method of [9] above, wherein the metal of Group 9 includes rhodium, iridium, or cobalt.
[11] The method of [9] or [10] above, wherein the metal of Group 13 includes at least one metal selected from among indium, aluminum, and gallium.
[12] The method of any of [9] to [11] above, wherein the p-type dopant includes magnesium.

Advantageous Effects of Invention

The oxide semiconductor film of a present inventive subject matter is sufficient in electrical conductivity and p-type semiconductor property. The method of manufacturing an oxide semiconductor film is capable of producing the above-mentioned oxide semiconductor film industrially advantageously.

DESCRIPTION EMBODIMENTS

Figure 1:
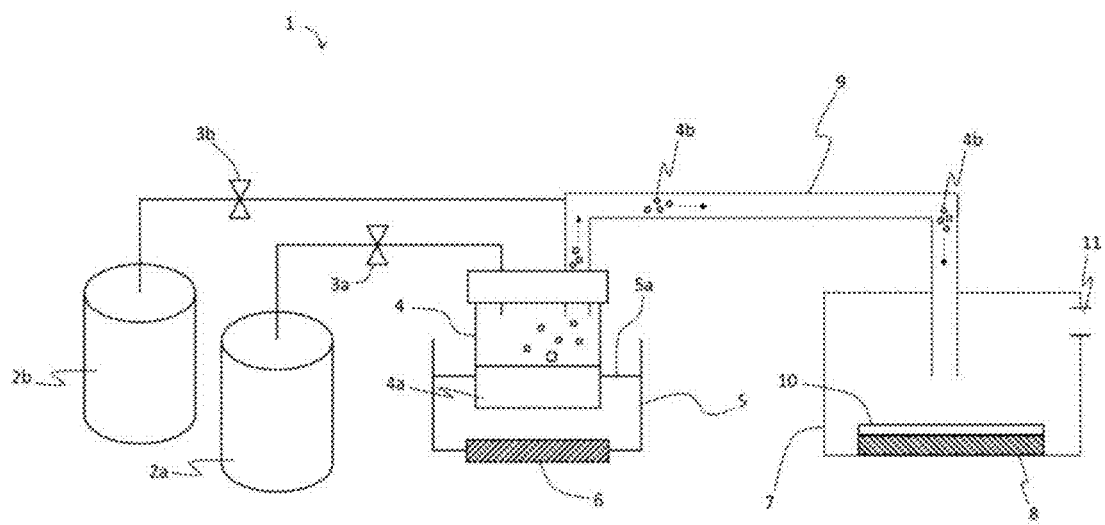
FIG. 1 shows a schematic diagram of a mist chemical vapor deposition (CVD) apparatus that may be used according to an embodiment of a present inventive subject matter.

Hereinafter, embodiments of a present inventive subject matter will be described in detail.
An oxide semiconductor film of the present inventive subject matter includes an oxide semiconductor film containing a metal oxide as a major component. The metal oxide contains a metal of Group 9 of the periodic table and/or a metal of Group 13 of the periodic table. Also, the oxide semiconductor film contains a p-type dopant and has a p-type carrier concentration that is $1\times10^{15}/cm^3$ or more and a hole mobility that is 1 $cm^2/Vs$ or more. The term "oxide semiconductor film" herein is not particularly limited as long as the "oxide semiconductor film" is an oxide semiconductor in the form of a film. The oxide semiconductor film may be a crystalline film. Also, the oxide semiconductor film may be an amorphous film. The oxide semiconductor film may be a single crystal film if the oxide semiconductor film is a crystalline film. Also, the oxide semiconductor film may be a polycrystalline film if the oxide semiconductor film is a crystalline film. According to an embodiment of the present inventive subject matter, the oxide semiconductor film is preferably a mixed crystal. The term "metal oxide" herein means a material including a metal element and oxygen. The term "major component" herein means that the oxide semiconductor contains a metal oxide that is 50% or more at atomic ratio in all the components in the oxide semiconductor that is p-type. According to an embodiment of a present inventive subject matter, the oxide semiconductor may preferably contain the metal oxide that is 70% or more at atomic ratio in all the components in the oxide semiconductor film that is p-type. For the present inventive subject matter, the oxide semiconductor film may further preferably contain the metal oxide that is 90% or more at atomic ratio in all the components in the oxide semiconductor film that is p-type. The oxide semiconductor film may contain the metal oxide that is 100% at atomic ratio in all the components in the oxide semiconductor film that is p-type. The term "periodic table" herein means the periodic table defined by the international Union of Pure and Applied Chemistry (IUPAC). The term "p-type carrier concentration" herein means a carrier concentration in the p-type semiconductor film measured by Hall effect measurement. According to an embodiment of the present inventive subject matter, the p-type carrier concentration may be preferably $1\times10^{17}/cm^3$ or more and may be further preferably $1\times10^{18}/cm^3$ or more. The term "hole mobility" herein means hole mobility measured by Hall effect measurement. According to an embodiment of the present inventive subject matter, the hole mobility of the oxide semiconductor film may be preferably 3 $cm^2/Vs$ or more.
Examples of the p-type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N, and P, and a combination of two or more of Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N and P. According to an embodiment of the present inventive subject matter, the p-type dopant may preferably contain a metal of Group 1 a metal of Group 2 of the periodic table, and further preferably contain a metal of Group 2 of the periodic table. According to an embodiment of the present inventive subject matter, the p-type dopan most preferably contains magnesium (Mg).

Examples of the metal of Group 9 of the periodic table include rhodium (Rh), iridium (Ir), cobalt (Co) and a combination of two or more of rhodium (Rh), iridium (Ir) and cobalt (Co). According to an embodiment of the present inventive subject matter, the metal of Group 9 of the periodic table may contain rhodium (Rh), iridium (Ir) or cobalt (Co), and preferably contain rhodium (Rh).

Examples of the metal of Group 13 of the periodic table include aluminum (Al), gallium (Ga), indium (In) thallium (Tl) and a combination of two or more of aluminum (Al), gallium (Ga), and indium (In). According to an embodiment of the present inventive subject matter, the metal of Group 13 of the periodic table may contain at least one metal selected from among indium (In), aluminum (Al) and gallium (Ga), and may preferably contain gallium or aluminum.

The oxide semiconductor film is preferably obtained, by generating atomized droplets by atomizing a raw material solution including a metal of Group 9 of the periodic table and/or a metal of Group 13 of the periodic table and a p-type dopant at (forming atomized droplets) as mentioned below, carrying the atomized droplets onto a surface of a base by using a carrier gas at (carrying atomized droplets) as mentioned below, and causing a thermal reaction of the atomized droplets adjacent to the surface of the base under an atmosphere of oxygen to form an oxide semiconductor film at (film formation) as mentioned below.

(Forming Atomized Droplets)

In forming atomized droplets, a raw material solution is atomized to generate atomized droplets. A raw material solution may be atomized by a known method, and the method is not particularly limited, however, according to an embodiment of the present inventive subject matter, the raw material solution is preferably atomized by use of ultrasonic vibration. Atomized droplets obtained by using ultrasonic vibration have an initial velocity that is zero and floats in the space. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of the atomized droplets is preferably 50 μm or less. The size of the atomized droplets is preferably in a range of 0.1 μm to 10 μm.

(Raw Material Solution)

If the raw material solution contains a metal of Group 9 and/or Group 13 of the periodic table and a p-type dopant, the raw material solution is not particularly limited, and thus may contain an inorganic material and/or an organic material. However, according to an embodiment of the present inventive subject matter, the raw material solution may contain the metal of Group 9 and/or Group 13 of the periodic table and the p-type dopant in the form of complex or salt, and dissolved or dispersed in an organic solvent or water. Examples of the form of the complex include acetylacetonate complexes, carbonyl complexes, amine complexes, hydride complexes. Also, examples of the form of salt include organic metal salts (e.g, metal acetate, metal oxalate, metal citrate, etc.), metal sulfide salt, metal nitrate salt, metal phosphate salt, metal halide salt (e.g., metal chloride salt, metal bromide salt, metal iodide salt, etc.).

A solvent of the raw material solution is not particularly limited, and thus, the solvent may be an inorganic solvent that includes water. The solvent may be an organic solvent that includes alcohol. The solvent may be a mixed solvent of the inorganic solvent and the organic solvent. According to an embodiment of the present inventive subject matter, the solvent may preferably contain water. Also, according to an embodiment of the present inventive subject matter, the solvent may be a mixed solvent of water and acid. Examples of water include pure water, ultrapure water, tap water, well water, mineral water, hot spring water, spring water, fresh water and ocean water. Examples of acid include inorganic acids such as hydrochloric acid, nitric acid, sulfuric acid, or organic acid such as acetic acid, propionic acid, and butanoic acid.

(Base)

The base is not particularly limited if the base is capable of supporting the oxide semiconductor film. The base material for the base is also not particularly limited if an object of the present inventive subject matter is not interfered with, and the base may be a base of a known material. Also, the base may contain an organic compound and/or inorganic compound. Also, the base may be in any shape and may be valid for all shapes. Examples of the shape of the base include a plate shape, a flat shape, a disc shape, a fibrous shape, a rod shape, a cylindrical shape, a prismatic shape, a tubular shape, a spiral shape, and a ring shape. According to an embodiment of the present inventive subject matter, a base may be preferably a substrate. Also, according to an embodiment of the present inventive subject matter, the thickness of the substrate is not particularly limited.

According to an embodiment of the present inventive subject matter, the substrate is not particularly limited and may be an electrically-insulating substrate, a semiconductor substrate or an electrically-conductive substrate. Examples of the substrate include a base substrate containing a substrate material with a corundum structure as a major component. The term "major component" herein means, for example, an atomic ratio of a substrate material with a certain crystal structure in all the elements in the substrate material may be 50% or more. According to an embodiment of the present inventive subject matter, the atomic ratio of the substrate material with a certain crystal structure in all the metal elements in the substrate material may be preferably 70% or more. For the present inventive subject matter, the atomic ratio of the substrate material with a certain crystal structure in all the metal elements in the substrate material may be further preferably 90% or more and may be 100%.

Furthermore, a material for the substrate is not particularly limited if an object of the present inventive subject matter is not interfered with, and also, the material may be a known one. Preferable examples of a substrate with a corundum structure include a sapphire substrate (preferably, a c-plane sapphire substrate), or an α-$Ga_2O_3$ substrate.

(Carrying Atomized Droplets)

In carrying atomized droplets, the atomized droplets are delivered into the base by carrier gas. The carrier gas is not particularly limited if an object of the present inventive subject matter is not interfered with, and thus, the carrier gas is may be oxygen, ozone, an inert gas such as nitrogen and argon. Also, the carrier gas may be a reducing gas such as hydrogen gas and/or forming gas. According to an embodiment of the present inventive subject matter, oxygen is preferably used as the carrier gas. Also, the carrier gas may contain one or two or more gasses. Also, a diluted carrier gas at a reduced flow rate (e.g, 10-fold diluted carrier gas) and the like may be used further as a second carrier gas. The carrier gas may be supplied from one or more locations. While the flow rate of the carrier gas is not particularly limited, the flow rate of the carrier gas may be in a range of 0.01 to 20 L/min. According to an embodiment of the present inventive subject matter, the flow rate of the carrier gas may be preferably in a range of 1 to 10 L/min. When a diluted carrier gas is used, the flow rate of the diluted carrier gas may be in a range of 0.001 to 2 L/min. Furthermore, according to an embodiment of the inventive subject matter, when a diluted carrier gas is used, the flow rate of the diluted carrier gas may be preferably in a range of 0.1 to 1 L/min.

(Film-Formation)

In the film-formation, the oxide semiconductor is formed on at least a part of the base by a thermal reaction of the atomized droplets adjacent to the surface of the base. The thermal reaction is not particularly limited if the atomized droplets react on heating, and reaction conditions are not particularly limited if an object of the present invention is not impaired. In the film-formation, the thermal reaction is conducted at an evaporations temperature or higher temperature of the evaporation temperature of the solvent of the raw material solution. During the thermal reaction, the temperature should not be too high. For example, the temperature during the thermal reaction may be 750° C. or less. The temperature during the thermal reaction may preferably 400° C. to 750° C. The thermal reaction may be conducted in any atmosphere of a vacuum, a non-oxygen atmosphere, a reducing-gas atmosphere, and an atmosphere of oxygen. Also, the thermal reaction may be conducted in any condition of under an atmospheric pressure, under an increased pressure, and under a reduced pressure. According to an embodiment of the present inventive subject matter, the thermal reaction is preferably conducted in an atmosphere of oxygen. Also, according to an embodiment of the present inventive subject matter, the thermal reaction if preferably conducted under an atmospheric pressure. The thermal reaction is further preferably conducted in an atmosphere of oxygen and under an atmospheric pressure. Also, a film thickness of the oxide semiconductor is able to be set by adjusting a film formation time. According to an embodiment of the present inventive subject matter, the film thickness of the oxide semiconductor may be preferably 1 µm or more.

According to an embodiment of the present inventive subject matter, the oxide semiconductor film may be provided directly on the base or may be provided via another layer such as a semiconductor layer (n-type semiconductor layer, n$^+$-type semiconductor layer, n$^-$-type semiconductor layer, for example) that is different from a semiconductor layer of the oxide semiconductor, an insulating layer including a semi-insulating layer, or a buffer layer on the base. Examples of the semiconductor layer and the insulating layer may include a semiconductor layer including the metal of Group 9 and/or Group 13 of the periodic table and an insulating layer including the metal of Group 9 and/or Group 13 of the periodic table. Preferable examples of the buffer layer include a semiconductor layer with a corundum structure, an insulating layer with a corundum structure, and a conductive layer with a corundum structure. Examples of the semiconductor layer include $\alpha$-Fe$_2$O$_3$, $\alpha$-Ga$_2$O$_3$, or $\alpha$-Al$_2$O$_3$. A method of forming the buffer layer is not particularly limited and may be by use of a method similarly to a method of forming the oxide semiconductor as mentioned above.

The oxide semiconductor layer obtained by above-mentioned method is able to be used for a semiconductor device as a p-type semiconductor layer. The oxide semiconductor film is particularly useful for a power device. Semiconductor devices may be categorized into lateral devices and vertical devise. In a lateral device, a first electrode and a second electrode may be formed on one side of a semiconductor layer. In a vertical device, a first electrode may be formed on a first side of a semiconductor layer, and a second electrode may be formed on a second side of the semiconductor layer. The first side may be positioned opposite to the second side of the semiconductor layer. According to an embodiment of a present inventive subject matter, the oxide semiconductor film may be used for the lateral devices and also used for vertical devices. According to an embodiment of the present inventive subject matter, the oxide semiconductor may be preferably used for vertical devices. Examples of the semiconductor device include Schottky barrier diodes (SBDs), metal semiconductor field-effect transistors (MESFETs), high-electron-mobility transistors (HEMTs), metal oxide semiconductor field-effect transistors (MOSFETs), static induction transistors (SITs), junction field-effect transistors (JFETs), insulated gate bipolar transistors (IGBTs), and light emitting diodes.

FIG. 3 to 9 show examples of using the oxide semiconductor film of the present inventive subject matter as a p-type semiconductor layer. According to an embodiment of the present inventive subject matter, an n-type semiconductor may be a semiconductor containing the same major component as major component of the oxide semiconductor film and an n-type dopant. The n-type semiconductor may be an n-type semiconductor containing a different major component that is different from the major component of the oxide semiconductor film.

Figure 3:
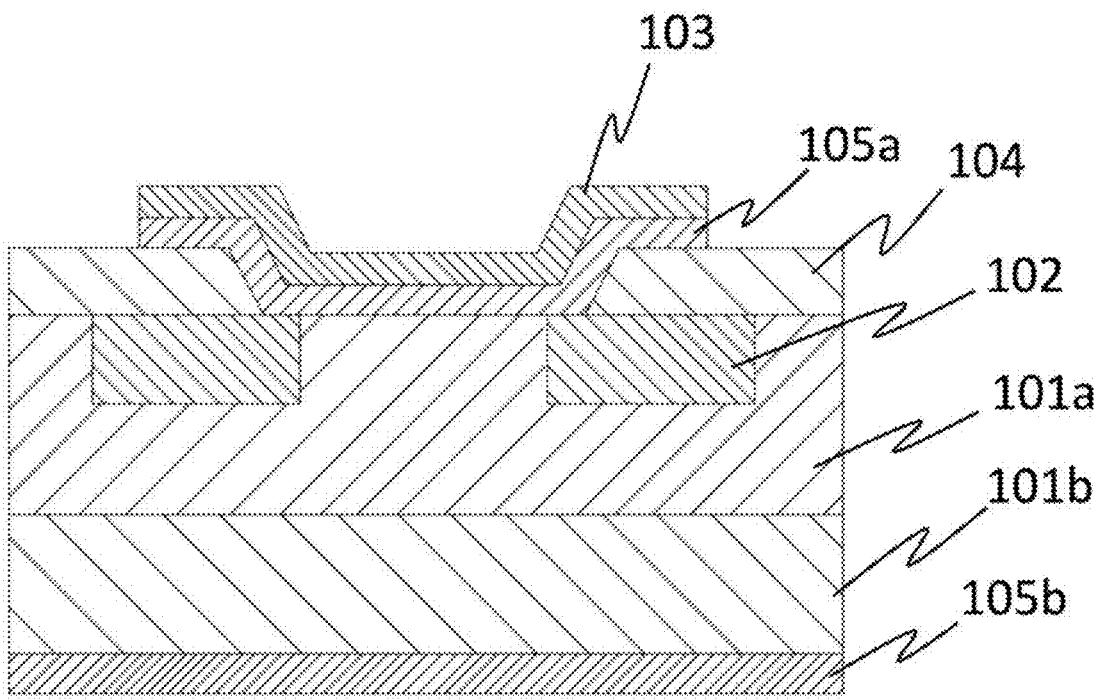
FIG. 3 shows a schematic view of an embodiment of a Schottky barrier diode (SBD) according to a present inventive subject matter.
Figure 4:
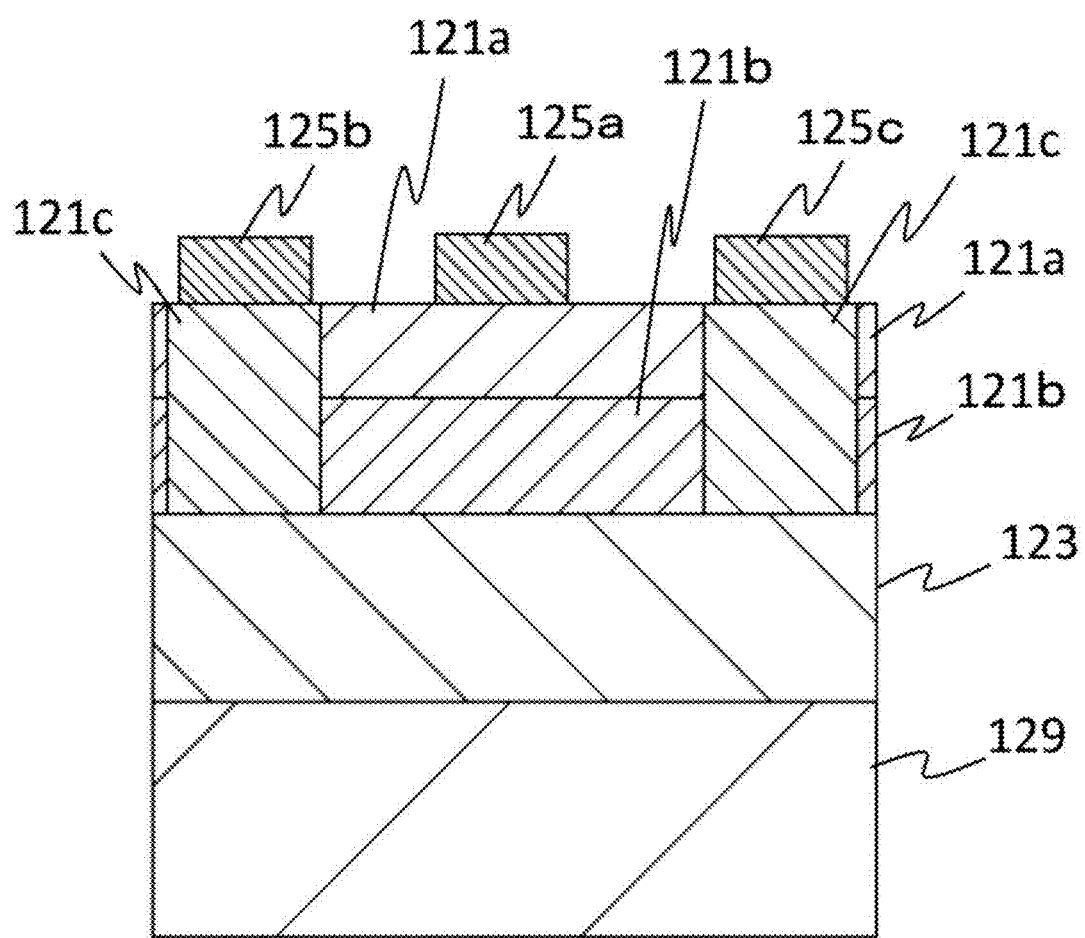
FIG. 4 shows a schematic view of an embodiment of a high electron mobility transistor (HEMT) according to a present inventive subject matter.

FIG. 3 shows a schematic view of an embodiment of a Schottky barrier diode (SBD) according to the present inventive subject matter including an n$^-$-type semiconductor layer 101a, an n$^+$-type semiconductor layer 101b, a p-type semiconductor layer 102, a metal layer 103, an insulating layer 104, a Schottky electrode 105a and an Ohmic electrode 105b. The metal layer 103 is comprised of a metal such as aluminum and covers the Schottky electrode 105a. FIG. 4 shows a schematic view of an embodiment of a high-electron-mobility transistor (HEMT) according to the present inventive subject matter including an n-type semiconductor layer with wide band gap 121a, an n-type semiconductor layer with narrow band gap 121b, an n$^+$-type semiconductor layer 121c, a p-type semiconductor layer 123, a gate electrode 125a, a source electrode 125b, a drain electrode 125c, and a substrate 129.

Figure 5:
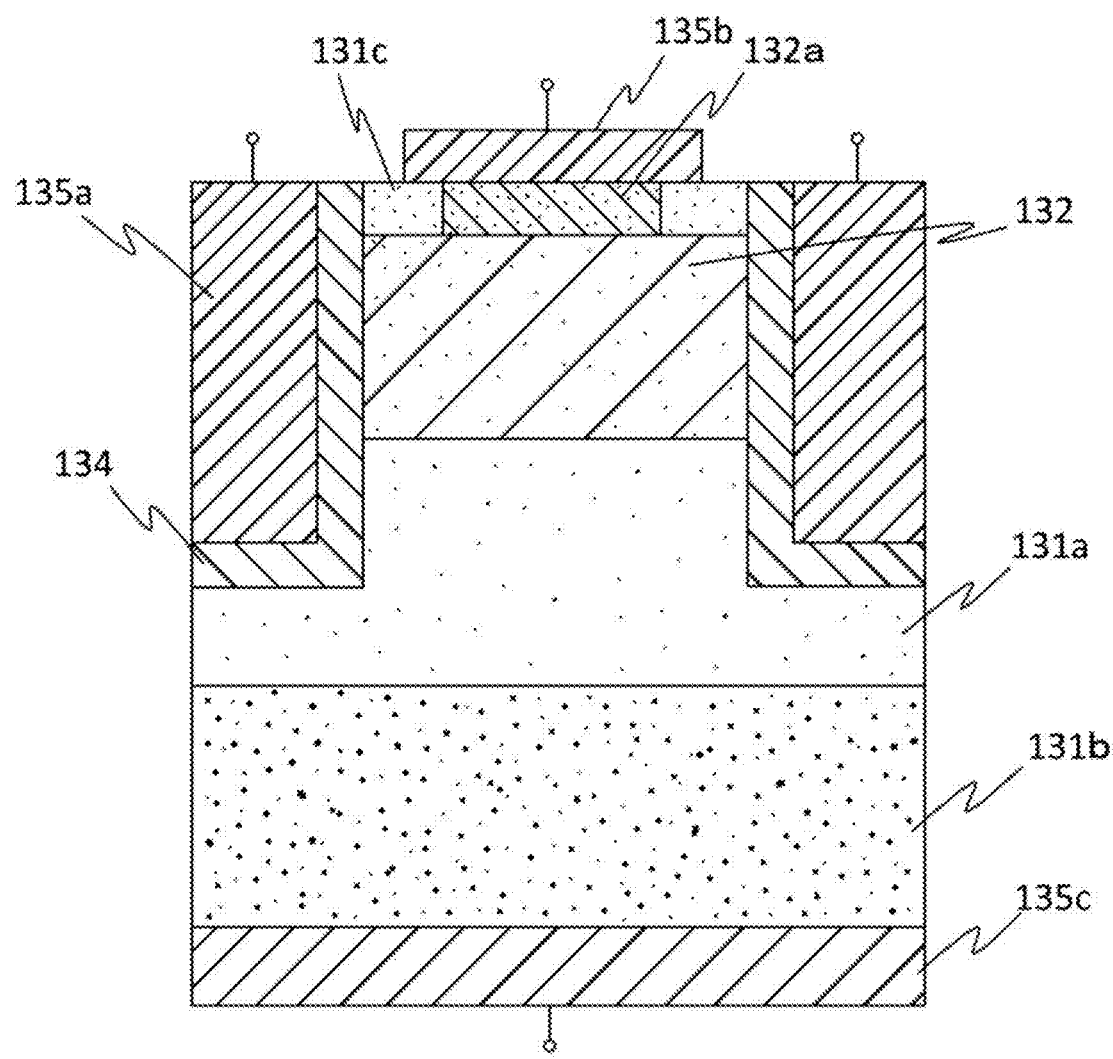
FIG. 5 shows a schematic view of an embodiment of a metal oxide semiconductor field effect transistor (MOSFET) according to a present inventive subject matter.
Figure 6:
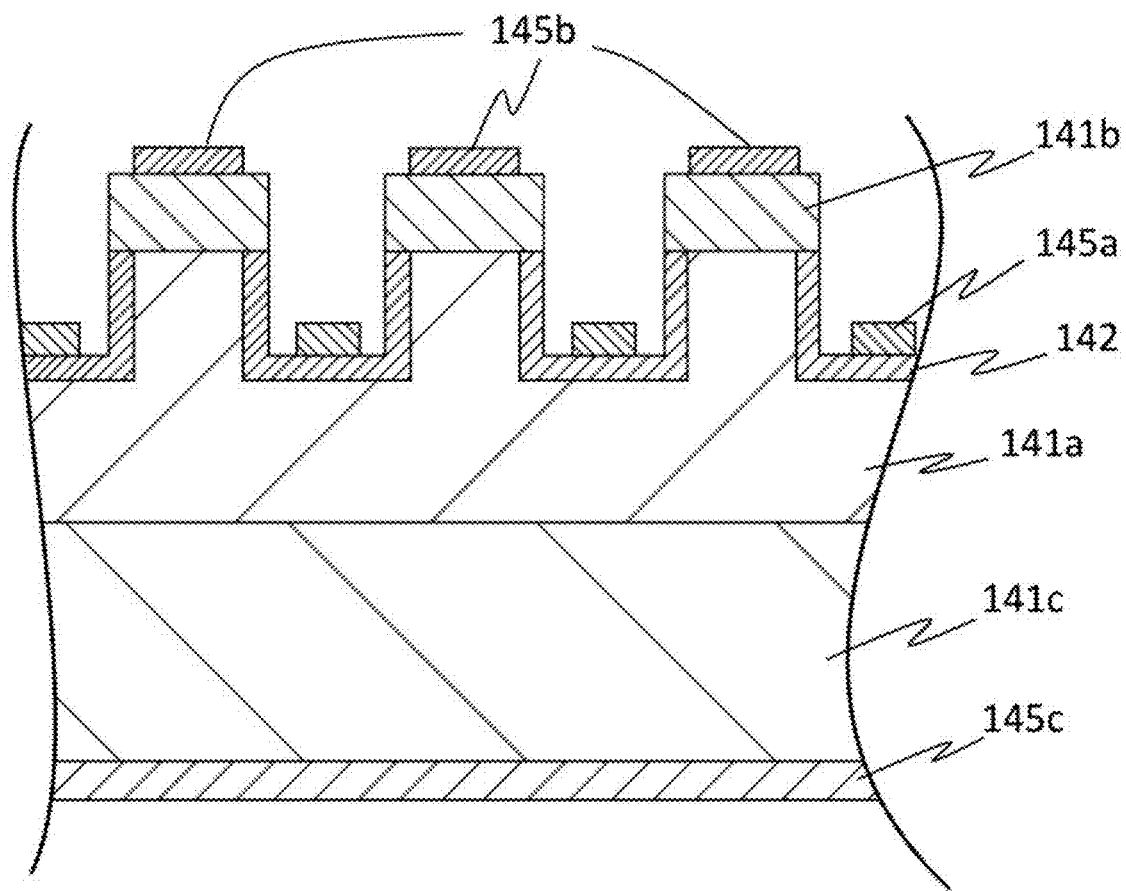
FIG. 6 shows a schematic view of an embodiment of junction field effect transistor (JFET) according to a present inventive subject matter.
Figure 7:
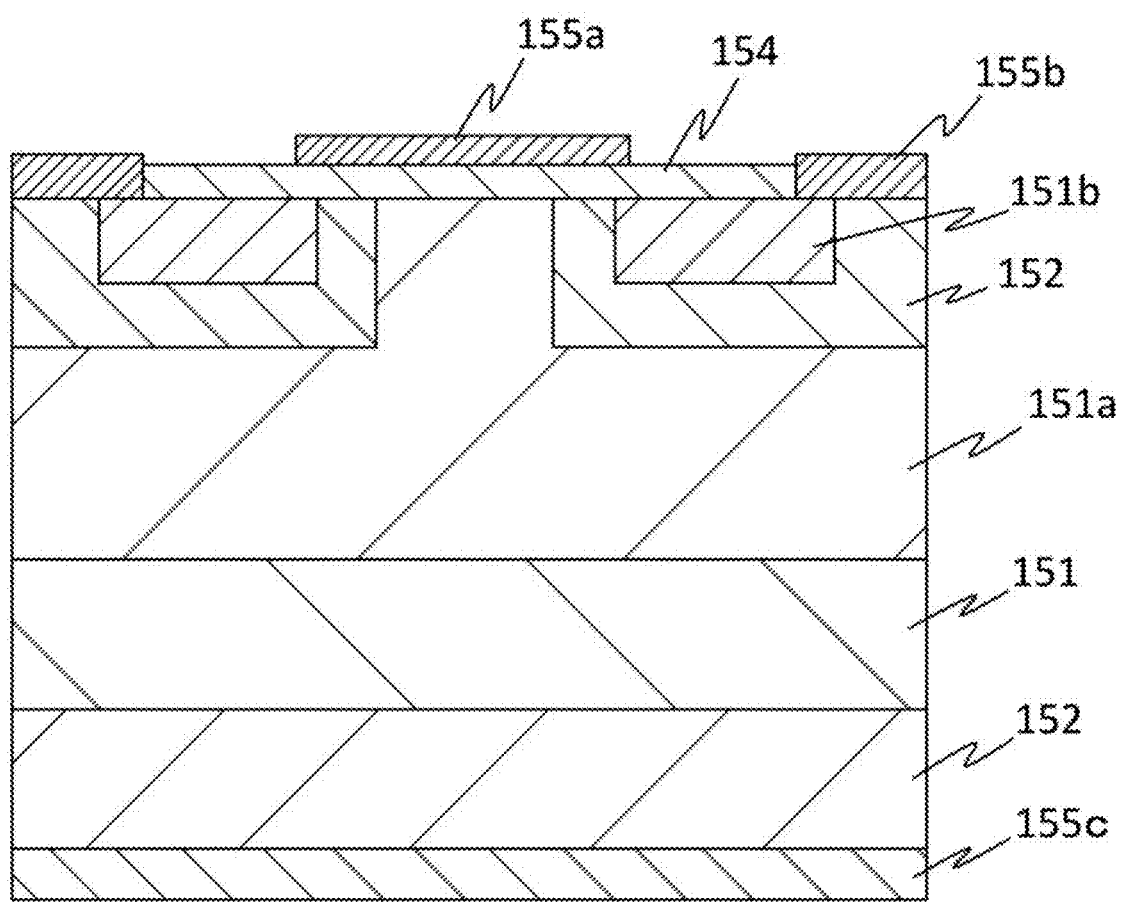
FIG. 7 shows a schematic view of an embodiment of insulated gate bipolar transistor (IGBT) according to a present inventive subject matter.

FIG. 5 shows a schematic view of an embodiment of a metal oxide semiconductor field-effect transistors (MOSFET) according to the present inventive subject matter. The MOSFET includes an n$^-$-type semiconductor layer 131a, a first n$^+$-type semiconductor layer 131b, a second n$^+$-type semiconductor layer 131c, a p-type semiconductor layer 132, a p$^+$-type semiconductor layer 132a, a gate insulating layer 134, a gate electrode 135a, a source electrode 135b and a drain electrode 135c. FIG. 6 shows a schematic view of an embodiment of a junction field-effect transistors (JFET) according to the present inventive subject matter including an n$^-$-type semiconductor layer 141a, a first n$^+$-type semiconductor layer 141b, a second n$^+$-type semiconductor layer 141c, a p-type semiconductor layer 142, a gate electrode 145a, a source electrode 145b and a drain electrode 145c. FIG. 7 shows a schematic view of an embodiment of an insulated gate bipolar transistor (IGBT) according to the present inventive subject matter including an n-type semiconductor layer 151, an n⁻-type semiconductor layer 151a, an n⁺-type semiconductor layer 151b, a p-type semiconductor layer 152, a gate insulating layer 154, a gate electrode 155a, an emitter electrode 155b and a collector electrode 155c.

Figure 8:
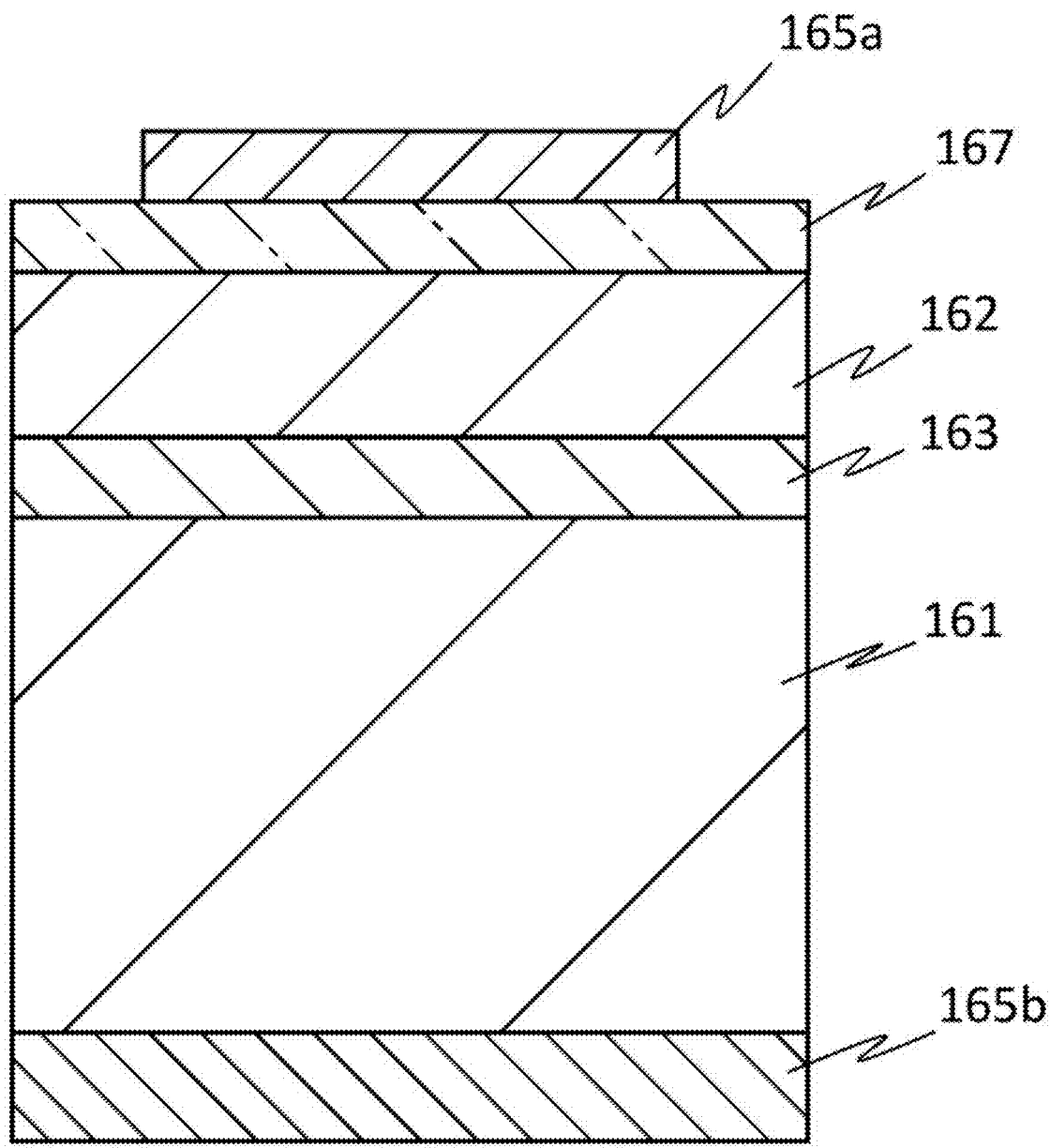
FIG. 8 shows a schematic view of an embodiment of light emitting diode according to a present inventive subject matter.

FIG. 8 shows a schematic view of an embodiment of a light emitting diode (LED) according to the present inventive subject matter. The LED shown in FIG. 8 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, that permeates the light generated in the light emitting layer 163, is provided on the p-type semiconductor layer 162. A first electrode is positioned on the light-transmitting electrode 167. A light emitting material used for the light emitting layer may be a known material. The light emitting device shown in FIG. 8 may be covered with a protective layer except for the electrode portion.

Examples of the material of the light-transmitting electrode may include oxide conductive material containing indium or titanium. Regarding the material of the light-transmitting electrode, in detail, the material may be $In_2O_3$, ZnO, $SnO_2$, $Ga_2O_3$, $TiO_2$, a mixed crystal thereof. The material may contain a dopant. By providing those materials using known method such as sputtering, the light-transmitting electrode would be formed. Also, annealing may be carried out after forming the light-transmitting electrode, in order to make the electrode more transparent.

According to the light emitting diode of FIG. 8, the light-emitting layer 163 is configured to emit light by applying a current to the p-type semiconductor layer 162, the light emitting layer 163, and the n-type semiconductor layer 161, through the first electrode 165a as a positive electrode and a second electrode 165b as a negative electrode.

Examples of the material of the first electrode 165a and the second electrode 165b may include Al, Mo, Co, Zr, Sn, Nb, Fe, Cr, Ta, Ti, Au, Pt, V, Mn, Ni, Cu, Hf, W, Ir, Zn, Pd, Nd, Ag and/or alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. A forming method of the first and the second electrode is not particularly limited. Examples of the forming method of the first and the second electrode include wet methods such as printing method, spray method, coating method, physical methods such as vacuum deposition method, sputtering method, ion plating method, chemical methods such as CVD method, plasma CVD method. The forming method may be selected from above mentioned methods in consideration of a suitability for the material of the first electrode and the second electrode.

Figure 9:
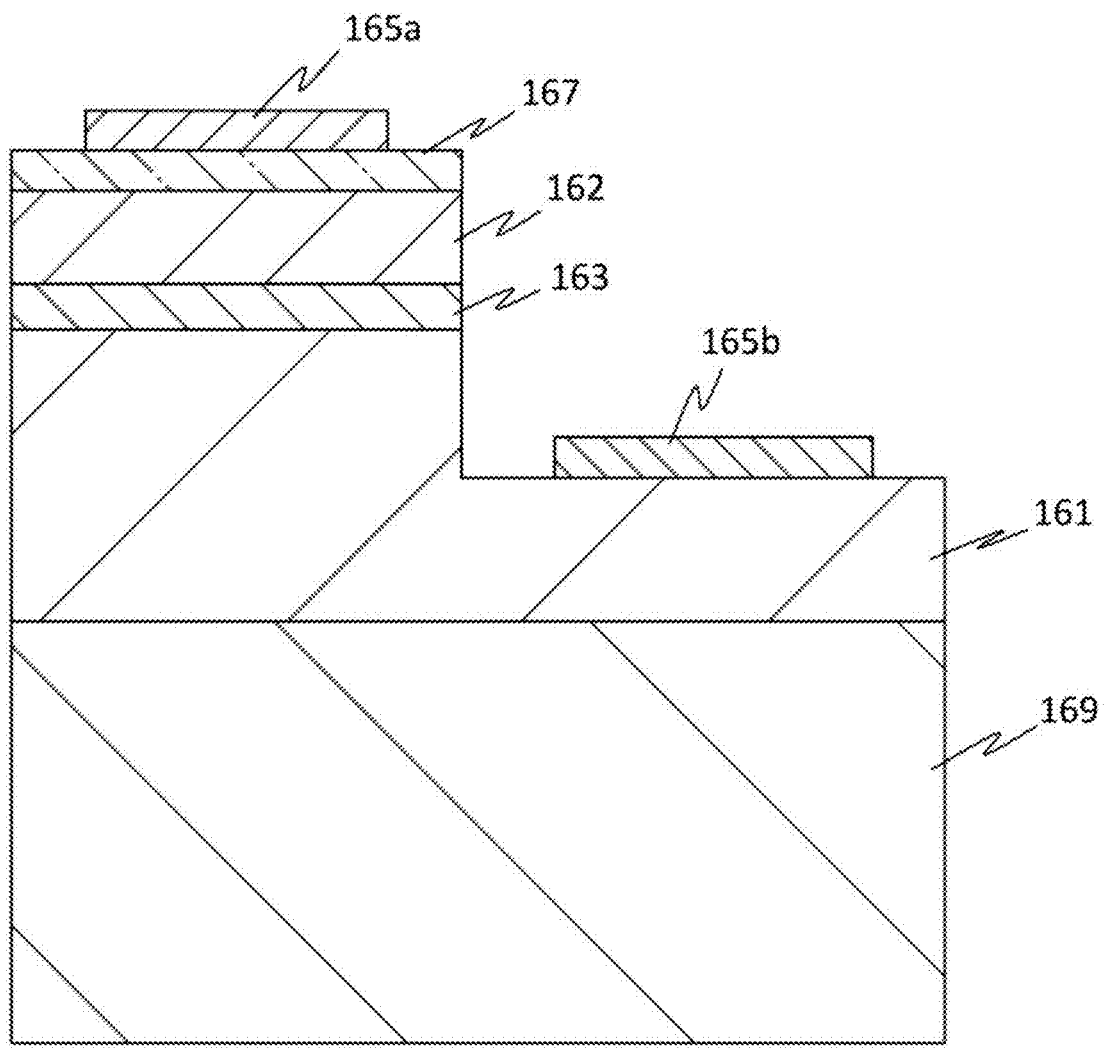
FIG. 9 shows a schematic view of an embodiment of light emitting diode according to a present inventive subject matter.

FIG. 9 shows a schematic view of another embodiment of a light emitting diode (LED) according to the present inventive subject matter. In the LED of FIG. 9, an n-type semiconductor layer 161 is arranged on the substrate 169, and the second electrode 165b is arranged on a part of the exposed surface of the n-type semiconductor layer 161, in which the exposed surface is formed by cutting out a part of a p-type semiconductor layer 162, light-emitting layer 163 and the n-type semiconductor layer 161.

Figure 10:
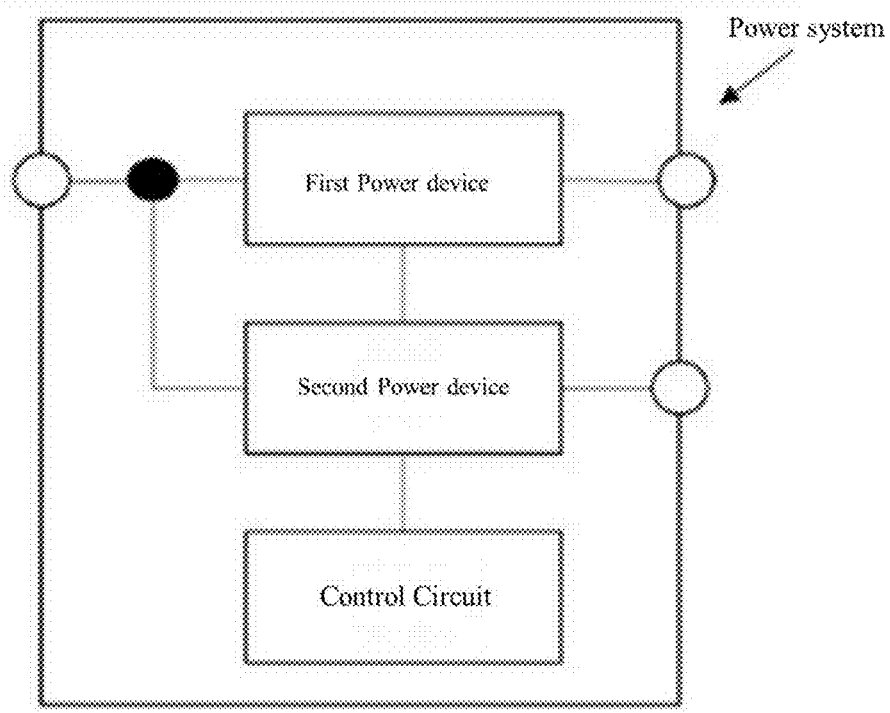
FIG. 10 shows a schematic view of a power system according to an embodiment of a present inventive subject matter.
Figure 11:
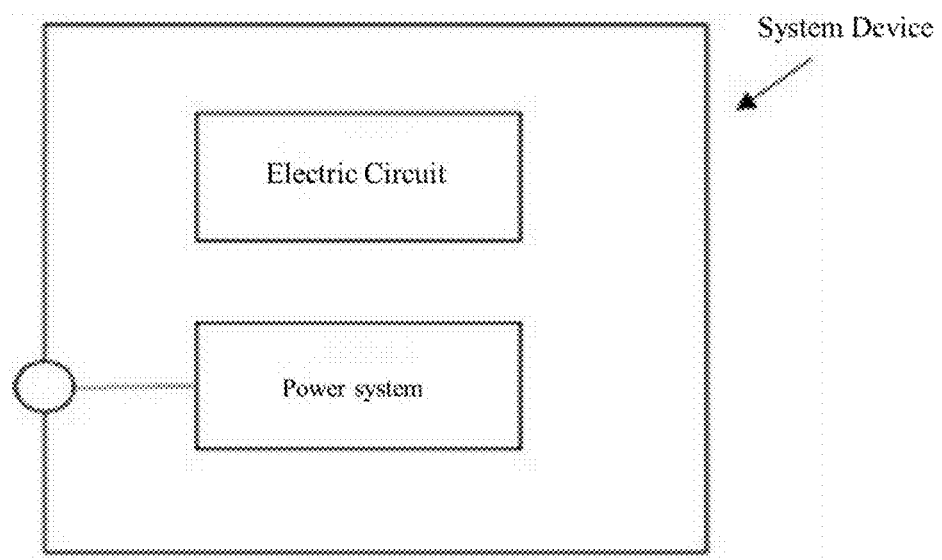
FIG. 11 shows a schematic view of a system device according to an embodiment of a present inventive subject matter.
Figure 12:
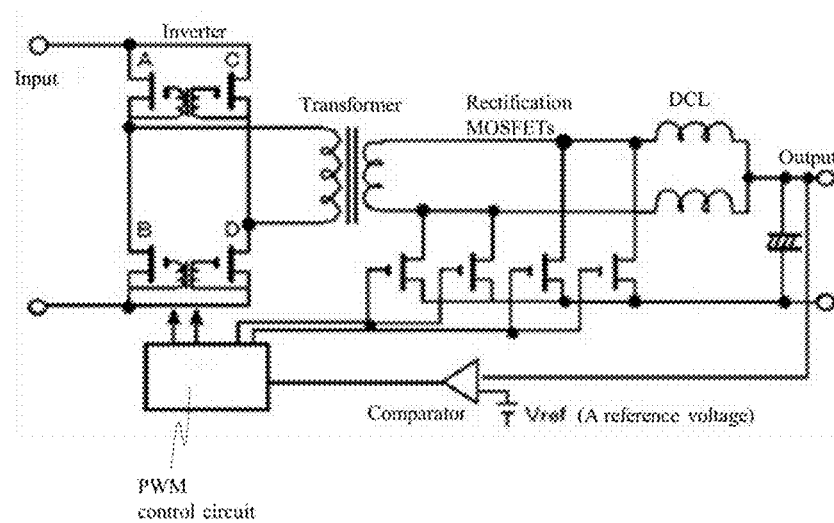
FIG. 12 shows a schematic view of a circuit diagram of power supply circuit of a power device according to an embodiment of a present inventive subject matter.

In addition, according to an embodiment of the present inventive subject matter, the semiconductor device may be used in a semiconductor system including a power source. The power source may be obtained by electrically connecting the semiconductor device to a wiring pattern using a known method. FIG. 10 shows a schematic view of a power system according to an embodiment of the present inventive subject matter. The semiconductor system of FIG. 10 includes two or more power devices (power sources) and a control circuit. The power system may be used for a system device in combination with an electric circuit, as shown in FIG. 11. FIG. 12 shows a schematic view of a circuit diagram of a power supply circuit of a power device including a power circuit and a control circuit. A DC voltage is switched at high frequencies by an inverter 192 (configured with MOSFET A to D) to be converted to AC, followed by an insulation and transformation by a transformer 193. The voltage is the rectified by rectification MOSFETs 194 and the smoothed by a DCL 195 (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLE

1. Film Formation Apparatus

Regarding a film-formation apparatus, a mist CVD apparatus 1 used in an embodiment of a method according to the present inventive subject matter is described below with FIG. 1. The mist CVD apparatus 1 includes a carrier gas source 2a, a first flow-control valve 3a that is configured to control a flow of carrier gas sent from the carrier gas source 2a, a diluted carrier gas source 2b, a second flow-control valve 3a that is configured to control a flow of diluted carrier gas sent from the diluted carrier gas source 2b, a generator 4 of atomized droplets containing a raw material solution 4a, a vessel 5 containing water 5a, an ultrasonic transducer 6 attached to a bottom of the vessel 5, a film-formation chamber 7, a supply pipe 9 connecting from the generator 4 of atomized droplets to the film-formation chamber 7, a hot plate 8 arranged in the film-formation chamber 7, and an exhaust duct 11 that is configured to exhaust atomized droplets, droplets and gas after thermal reaction. Also, a substrate 10 may be placed on the hot plate 8.

2. Preparation of a Raw-Material Solution

Aluminum acetylacetonate (1.6 g), rhodium acetylacetonate (0.06 g), magnesium acetylacetonate (0.5 g) and hydrochloric acid (6 mL) were mixed with water (520 mL) to make a raw-material solution.

3. Film Formation Preparation

The raw-material solution 4a obtained at 2. Preparation of a Raw-Material Solution was contained in the generator 4 of atomized droplets. Then, a c-plane sapphire substrate was placed on the hot plate 8 as a substrate 10, and the hot plate 8 was activated to raise the temperature in the film-formation chamber 7 up to 550° C. The first flow-control valve 3a and the second flow-control valve 3b were opened to supply a carrier gas from the carrier gas source 2a and the diluted carrier gas source 2b, which are the source of carrier gas, into the film-formation chamber 7 to replace the atmosphere in the film-formation chamber 7 with the carrier gas. The flow rate of the carrier gas from the carrier gas source 2a was regulated at 2.0 L/min, and the diluted carrier gas from the diluted carrier gas source 2b was regulated at 0.5 L/min. In this embodiment, oxygen was used as the carrier gas.

4. Formation of a Film that is an Oxide Semiconductor Film

The ultrasonic transducer 6 was then vibrated at 2.4 MHz, and the vibration propagated through the water 5a to the raw material solution 4a to atomize the raw material solution 4a to form atomized droplets 4b. The atomized droplets 4b were sent through a supply pipe 9 with the carrier gas and introduced in the film-formation chamber 7. The atomized droplets were thermally reacted at 550° C. under atmospheric pressure in the film-formation chamber 7 to form a film on the substrate 10. The film formation time was 12 hours.

Figure 2:
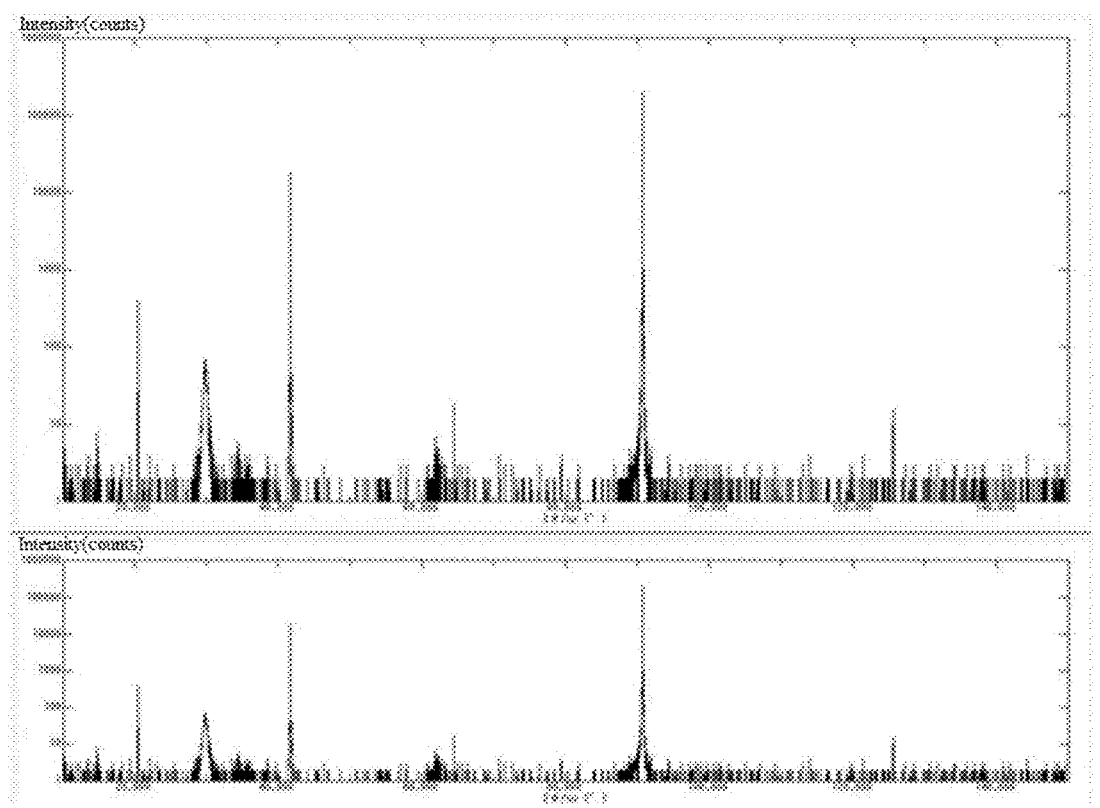
FIG. 2 shows a measurement result of an embodiment measured by an X-ray diffraction (XRD).
Figure 13:
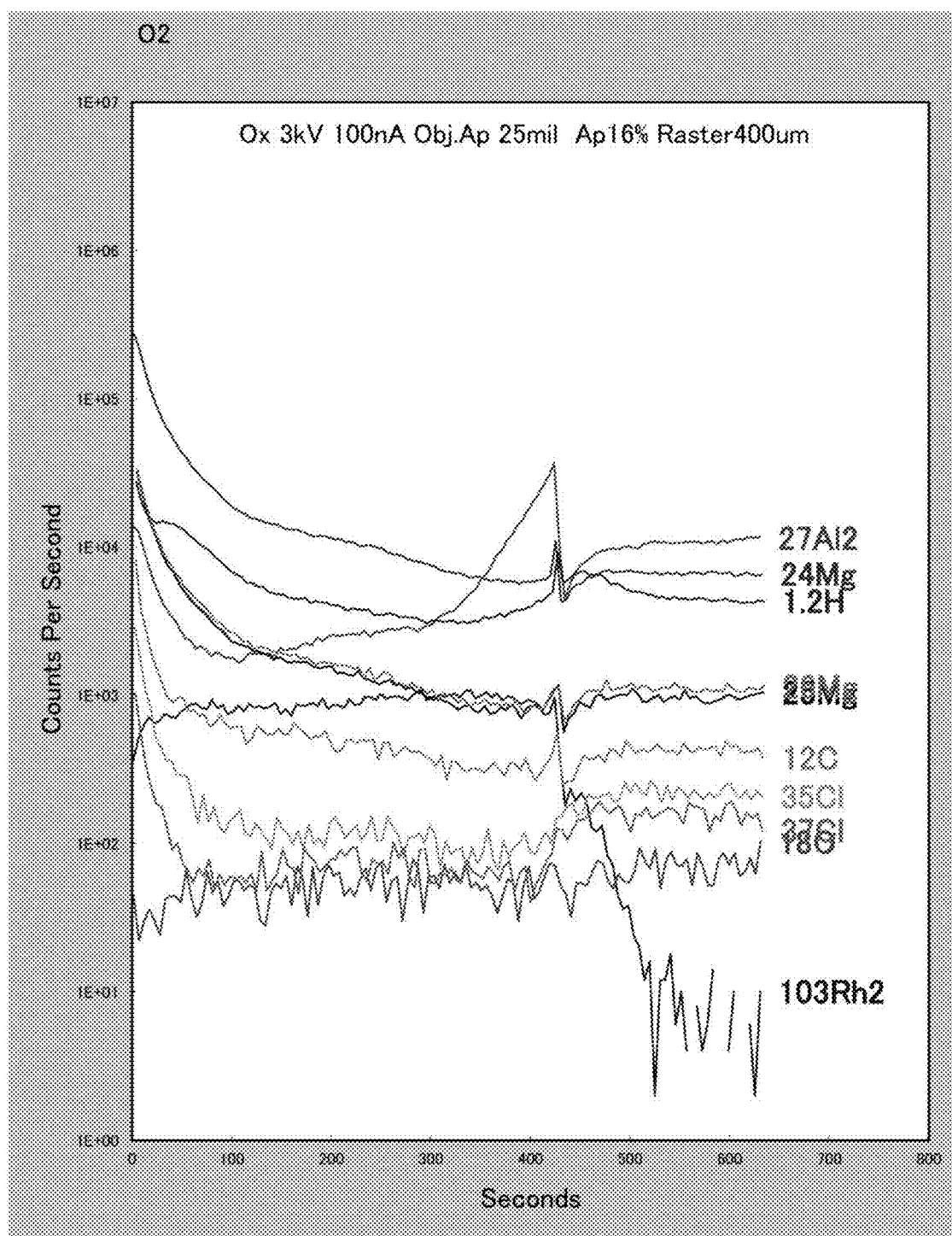
FIG. 13 shows a measurement result of an embodiment measured by Secondary Ion Mass Spectrometry (SIMS).

Using a Secondary Ion Mass Spectrometry (SIMS) an X-ray Photoelectron Spectroscopy (XPS), and an X-ray diffraction (XRD) device, a phase of the film obtained at 4. Formation of a film described above was identified as an AlRhO film. FIG. 2 shows a result of XRD, and FIG. 13 shows result of SIMS. Also, a Hall effect of the AlRhO film was measured and revealed to have the carrier type that was p-type, and carrier concentration that was $7.79 \times 10^{18}$ (/cm$^3$), and hole mobility that was 3 (cm$^2$/Vs).

INDUSTRIAL APPLICABILITY

An oxide semiconductor film according to the present inventive subject matter is useful as a p-type semiconductor, and applicable to semiconductor devices (e.g, compound semiconductor devices) and electronic components and electronic devices, optical and electronic photography related devices, and industrial parts. Since the oxide semiconductor film according to the present inventive subject matter has an enhanced p-type semiconductor property, the oxide semiconductor film is, in particular, applicable to semiconductor devices.

REFERENCE NUMBER DESCRIPTION

1 Mist CVD apparatus
2a a carrier gas source
2b a diluted carrier gas source
3a a flow regulating valve
3b a flow regulating valve
4 a generator of atomized droplets
4a a raw material solution
4b atomized droplets
5 a vessel
6 an ultrasonic transducer
7 a film-forming chamber
8 a hot plate
9 a supply pipe
10 a heater
11 an air duct
101a an n$^-$-type semiconductor layer
101b an n$^+$-type semiconductor layer
103 a metal layer
104 an insulating layer
105a a Schottky electrode
105b an Ohmic electrode
121a an n-type semiconductor layer with wide band gap
121b an n-type semiconductor layer with narrow band gap
121c an n+-type semiconductor layer
123 a p-type semiconductor layer
125a a gate electrode
125b a source electrode
125c a drain electrode
128 a buffer layer
129 a substrate
131a an n$^-$-type semiconductor layer
131b a first n$^+$-type semiconductor layer
131c a second n$^+$-type semiconductor layer
132 p-type semiconductor layer
134 a gate insulating film
135a a gate electrode
135b a source electrode
135c a drain electrode
138 a buffer layer
139 a semi-insulating layer
141a n$^-$-type semiconductor layer
141b a first n$^+$-type semiconductor layer
141c a second n$^+$-type semiconductor layer
142 a p-type semiconductor layer
145a a gate electrode
145b a source electrode
145c a drain electrode
151 an n-type semiconductor layer
151a an n$^-$-type semiconductor layer
151b an n$^+$-type semiconductor layer
152 a p-type semiconductor layer
154 a gate insulating layer
155a a gate electrode
155b an emitter electrode
155c a collector electrode
161 an n-type semiconductor layer
162 a p-type semiconductor layer
163 a light emitting diode
165a a first electrode
165b a second electrode
167 a translucent electrode
169 a substrate

What is claimed is:

1. A semiconductor device comprising:
a p-type semiconductor layer having a metal oxide as a major component including a metal of Group 9 of the periodic table and/or a metal of Group 13 of the periodic table;
an n-type semiconductor layer having a metal oxide as a major component including a metal of Group 13 of the periodic table; and
an electrode arranged on at least one of the p-type semiconductor layer or the n-type semiconductor layer,
wherein the p-type semiconductor layer has a p-type carrier concentration of $1 \times 10^{15}$/cm$^3$ or more,
wherein the p-type semiconductor layer has a hole mobility of 1 cm$^2$/Vs or more, and
wherein the p-type semiconductor layer and the n-type semiconductor layer are crystalline.

2. The semiconductor device according to claim 1, wherein the metal of Group 9 includes rhodium, iridium, or cobalt.

3. The semiconductor device according to claim 1, wherein the metal of Group 13 includes at least one metal selected from among indium, aluminum, and gallium.

4. The semiconductor device according to claim 1, wherein the p-type semiconductor layer includes a magnesium dopant.

5. The semiconductor device according to claim 1, wherein the p-type semiconductor layer is a thermoelectric conversion element.

6. The semiconductor device according to claim 1, wherein the p-type semiconductor layer and the n-type semiconductor layer include a mixed crystal.

7. A semiconductor system comprising:
the semiconductor device according to claim 1.

8. A semiconductor device comprising:
a light-emitting layer having a first surface and a second surface;
a p-type semiconductor layer having a metal oxide as a major component including a metal of Group 9 of the periodic table and/or a metal of Group 13 of the periodic table positioned on the first surface of the light-emitting layer; and an n-type semiconductor layer having a metal oxide as a major component including a metal of Group 13 of the periodic table positioned on the second surface of the light-emitting layer, wherein the p-type semiconductor layer has a p-type carrier concentration of $1\times10^{15}/cm^3$ or more, wherein the p-type semiconductor layer has a hole mobility of 1 $cm^2/Vs$ or more, and wherein the p-type semiconductor layer and the n-type semiconductor layer are crystalline.

9. A semiconductor device comprising:

a p-type semiconductor layer having a metal oxide as a major component including a metal of Group 9 of the periodic table and/or a metal of Group 13 of the periodic table;

an n-type semiconductor layer having a metal oxide as a major component including a metal of Group 13 of the periodic table;

a first electrode formed on the p-type semiconductor layer; and a second electrode formed on the n-type semiconductor layer, wherein the p-type semiconductor layer has a p-type carrier concentration of $1\times10^{15}/cm^3$ or more, wherein the p-type semiconductor layer has a hole mobility of 1 $cm^2/Vs$ or more, and wherein the p-type semiconductor layer and the n-type semiconductor layer are crystalline.

10. A semiconductor device comprising:

a p-type semiconductor layer having a metal oxide as a major component including a metal of Group 9 of the periodic table and/or a metal of Group 13 of the periodic table;

an n-type semiconductor layer having a metal oxide as a major component including a metal of Group 13 of the periodic table; and an electrode arranged on at least one of the p-type semiconductor layer or the n-type semiconductor layer, wherein the p-type semiconductor layer has a hole mobility of 1 cm2/Vs or more, and wherein the p-type semiconductor layer and the n-type semiconductor layer are crystalline.

11. A method of manufacturing an oxide semiconductor device, the method comprising:

generating atomized droplets for a p-type semiconductor layer by atomizing a raw material solution comprising a metal of Group 9 of the periodic table and/or a metal of Group 13 of the periodic table;

generating atomized droplets for an n-type semiconductor layer by atomizing a raw material solution comprising a metal of Group 13 of the periodic table;

carrying the atomized droplets onto a surface of a base by using a carrier gas; and causing a thermal reaction of the atomized droplets adjacent to the surface of the base under an atmosphere of oxygen to form the oxide semiconductor layer on the base.

12. The method according to claim 11, wherein the metal of Group 9 includes rhodium, iridium, or cobalt.

13. The method according to claim 11, wherein the metal of Group 13 includes at least one metal selected from among indium, aluminum, and gallium.

14. The method according to claim 11, wherein the p-type semiconductor layer includes a magnesium dopant.

* * * * *